(12) United States Patent
Chane-Ching et al.

(10) Patent No.: US 9,525,095 B2
(45) Date of Patent: Dec. 20, 2016

(54) COLLOIDAL DISPERSION OF A MATERIAL IN A DIVIDED STATE AND CONSISTING OF METAL CHALCOGENIDE IN AN AQUEOUS MEDIUM, MATERIAL IN A DIVIDED STATE, AND USES THEREOF

(75) Inventors: Jean-Yves Chane-Ching, Toulouse (FR); Oana Zaberca, Toulouse (FR); Azmach Tolesa, Toulouse (FR); Andrea Balocchi, Ramonville Saint Agne (FR)

(73) Assignees: UNIVERSITE PAUL SABATIER TOULOUSE III, Toulouse (FR); CENTRE NATIONAL DE LA RECHERCHE SCIENTIFIQUE (C.N.R.S.), Paris (FR); INSTITUT NATIONAL DES SCIENCES APPLIQUEES DE TOULOUSE, Toulouse (FR); ECOLE SUPERIEURE DES BEAUX-ARTS DE LA REUNION, Le Port (FR)

( * ) Notice: Subject to any disclaimer, the term of this patent is extended or adjusted under 35 U.S.C. 154(b) by 408 days.

(21) Appl. No.: 14/003,955

(22) PCT Filed: Mar. 7, 2012

(86) PCT No.: PCT/FR2012/050475
§ 371 (c)(1),
(2), (4) Date: Oct. 28, 2013

(87) PCT Pub. No.: WO2012/120237
PCT Pub. Date: Sep. 13, 2012

(65) Prior Publication Data
US 2014/0044969 A1 Feb. 13, 2014

(30) Foreign Application Priority Data
Mar. 9, 2011 (FR) ..................... 11 00703

(51) Int. Cl.
*H01B 1/06* (2006.01)
*H01L 35/00* (2006.01)
(Continued)

(52) U.S. Cl.
CPC ............... *H01L 31/18* (2013.01); *B82Y 30/00* (2013.01); *C01G 19/006* (2013.01);
(Continued)

(58) Field of Classification Search
CPC ............... H01B 1/00; H01B 1/06; H01B 1/10; H01B 1/22; C01G 3/00; C01G 3/12; C01G 19/00; H01L 35/00
See application file for complete search history.

(56) References Cited

U.S. PATENT DOCUMENTS 8,574,538 B2 * 11/2013 Chane-Ching ........... B01J 27/04
136/244
9,093,190 B2 * 7/2015 Agrawal ............... C23C 18/127
(Continued)

FOREIGN PATENT DOCUMENTS

WO 2009137637 A2 11/2009
WO 2011030055 A1 3/2011
WO 2011/066205 A1 * 6/2011

OTHER PUBLICATIONS

Shavel et al "Synthesis of quaternary chalcogenide nanocrystals: stannite Cu2ZnxSnySe1+x+2y", J. Am. Chem. Soc. 2010, 132, 4514-4515.*
(Continued)

Primary Examiner — Mark Kopec
(74) Attorney, Agent, or Firm — Young & Thompson (57) ABSTRACT

A colloidal dispersion of a metal chalcogenide material in divided state in an aqueous liquid phase selected from the group consisting of aqueous solutions and solutions including a mixture of water and at least one solvent that is
(Continued)

miscible with water, wherein the carbon element of the material is present in a proportion of less than 2.5 wt. % as determined by elemental analysis, the concentration of the material in the colloidal dispersion is more than 40 g/l, and the colloidal dispersion has a charge potential value which is negative and the absolute value of which is higher than 20 mV.

17 Claims, 1 Drawing Sheet

(51) Int. Cl.
    *C01G 3/00* (2006.01)
    *H01L 31/18* (2006.01)
    *B82Y 30/00* (2011.01)
    *C01G 19/00* (2006.01)
    *C01G 23/00* (2006.01)
    *C01G 25/00* (2006.01)
    *H01L 31/032* (2006.01)

(52) U.S. Cl.
    CPC ......... *C01G 23/002* (2013.01); *C01G 25/006* (2013.01); *H01B 1/06* (2013.01); *H01L 31/0326* (2013.01); *C01P 2002/50* (2013.01); *C01P 2002/72* (2013.01); *C01P 2002/82* (2013.01); *C01P 2004/03* (2013.01); *C01P 2004/62* (2013.01); *C01P 2004/64* (2013.01); *C01P 2006/40* (2013.01); *C01P 2006/80* (2013.01); *Y02E 10/50* (2013.01); *Y10T 428/2982* (2015.01)

(56) References Cited

U.S. PATENT DOCUMENTS

| 2012/0219797 A1* | 8/2012 | Mitsumoto | C01G 1/12 428/402 |
| 2012/0231276 A1 | 9/2012 | Chane-Ching et al. | |
| 2012/0288987 A1* | 11/2012 | Radu | B82Y 30/00 438/95 |
| 2015/0137039 A1* | 5/2015 | Agrawal | C01B 19/002 252/364 |

OTHER PUBLICATIONS

Fischereder et al "Investigation of Cu2ZnSnS4 formation from metal salts and thioacetamide", Chem. Mater. 2010, 22, 3399-3406.*

Cruz et al., "XRD, XPS and 119Sn NMR Study of Tin Sulfides Obtained by Using Chemical Vapor Transport Methods", Journal of Solid State Chemistry, 2003, vol. 175, pp. 359-365.

Kovalenko et al., "Expanding the Chemical Versatility of Colloidal Nanocrystals Capped with Molecular Metal Chalcogenide Ligands", Journal of American Chemical Society, 2010, vol. 132, pp. 10085-10092.

International Search Report, dated May 15, 2012, from corresponding PCT application.

* cited by examiner

COLLOIDAL DISPERSION OF A MATERIAL IN A DIVIDED STATE AND CONSISTING OF METAL CHALCOGENIDE IN AN AQUEOUS MEDIUM, MATERIAL IN A DIVIDED STATE, AND USES THEREOF

The invention relates to a colloidal dispersion of a material in the divided state in an aqueous liquid phase. The invention relates also to such a material in the divided state formed of crystalline solid particles of at least one metal chalcogenide. The invention relates also to the use of such a colloidal dispersion for the production of a photoabsorbent film of a photovoltaic cell, and to a photovoltaic cell comprising such a photoabsorbent film.

Such a colloidal dispersion and such a material in the divided state are used in the field of the valorization of clean and renewable energies, especially solar energy, to produce a photoabsorbent film of small thickness, especially in a photovoltaic cell.

Particles of $Cu_2ZnSnS_4$ (Steinhagen et al., (2009), *J. Am. Chem. Soc.*, 131, 12554-12555) which have a size of the order of 13 nm and are obtained by controlled precipitation of metal precursors in oleylamine are known. Such a process does not allow the production of particles which have a size greater than 13 nm and which are substantially free of carbon. The described particles are dispersed in toluene and are therefore not compatible with water. Nor does such a process allow the production of a concentrated and stable dispersion of such particles in an aqueous solvent. Furthermore, the described particles are dispersed in toluene, which is not an aqueous solvent and is toxic to humans and does not respect the environment.

Furthermore, these particles are not free of hydrocarbon-containing surfactant, especially oleylamine. Consequently, a dispersion of such nanocrystals in toluene does not permit the formation of a film of particles that is adapted to permit the formation by sintering of a photoelectric film of photovoltaic quality.

The invention aims to remedy the disadvantages mentioned above by providing a colloidal dispersion of a material in the divided state in an aqueous liquid phase, and a material in the divided state, which are of high purity and which are adapted to be able to be used in the production of a photoabsorbent film which is of small thickness and has a high photovoltaic conversion efficiency.

In particular, the invention relates to such a colloidal dispersion and to such a material in the divided state which permit, after sintering, the formation of a structured film on the submicron scale and on the nanometric scale on a substrate, for example a substrate made of glass or of steel covered with an electrode.

The invention relates also to a colloidal dispersion and to a material in the divided state which are adapted to be able to permit the formation of a layer of solid particles of submicron size having a high density on a substrate and the formation of a photoelectric film by sintering of said layer of particles.

The invention relates further to such a colloidal dispersion and to such a material in the divided state which are adapted to be able to be employed industrially in the production of photoabsorbent films of photovoltaic cells.

In particular, the invention relates to such a colloidal dispersion and to such a material in the divided state for the production of photoabsorbent films which are substantially free of structural defects capable of forming electron/hole recombination traps.

In particular, the invention relates to such a colloidal dispersion which has a high concentration and is substantially free of thiocyanate anion $SCN^-$; of thiourea $CS(NH_2)_2$, of thioacetamide ($CH_3$—S—$NH_2$) and their degradation products.

The invention relates also to such a material in the divided state which is compatible with polar solvents, especially compatible with water, and which is adapted to be able to be dispersed in an aqueous liquid phase by simple addition of water and to form a colloidal dispersion of said material in the divided state in an aqueous liquid phase, the material in the divided state being a redispersible powder.

The invention relates also to such a material in the divided state which is adapted to be able to form a stable colloidal dispersion in an aqueous liquid phase, including at a high concentration of the material in the divided state in the colloidal dispersion.

The invention relates further to a colloidal dispersion of such a material in the divided state in an aqueous liquid phase which is stable over time, especially to settling, including at a high concentration of material in the divided state in an aqueous liquid phase.

In particular, the invention relates to such a colloidal dispersion and to such a material in the divided state which do not comprise a hydrocarbon-containing compound, especially a surfactant compound, adsorbed on or in interaction with the surface of the solid particles forming the material in the divided state.

The invention aims also to achieve all those objectives at a lower cost by proposing such a colloidal dispersion and such a material in the divided state which have a low production cost and which are produced from conventional chemical components which are abundant in nature and/or are inexpensive.

The invention relates also to a colloidal dispersion of such a material in the divided state in an aqueous liquid phase which can be applied by coating to the surface of a substrate or of a substrate covered with an electrode so as to permit the formation of a thin semi-conducting layer of said material in the divided state without requiring either a method of vacuum deposition, especially by sputtering under reduced pressure, or electrodeposition. The invention relates to such a colloidal dispersion suitable for forming an ink adapted to be able to be coated on the surface of a substrate.

The invention relates in particular to the use of such a colloidal dispersion in the production of a thin film on the surface of a substrate, in particular of a substrate of complex shape, especially a non-planar substrate.

To that end, the invention relates to a colloidal dispersion of a material in the divided state in an aqueous liquid phase chosen from the group formed of aqueous solutions, and mixed solutions of water and at least one water-miscible solvent, said material in the divided state being formed of solid particles of the following general composition (A):

(A), wherein:
a, b, c, v, w, x and y and their arithmetic combinations are real numbers which represent the molar proportion of each element with which each number is associated in formula (A), such that:
1≤a<1.65;
1≤b<1.40;
4<c<9, and v, w, x and y belong independently of one another to the group of the real numbers belonging to the interval [0; 0.5[, and $^1X^{+4}$ is chosen from the group formed of the cations of titanium (Ti), the cations of zirconium (Zr) and the cations of lead (Pb), $^2X^{+3}$ is chosen from the group formed of the cations of gallium (Ga), the cations of indium (In) and the cations of yttrium (Y); and the material in the divided state having, as determined by elemental analysis, a proportion by mass of carbon element of less than 2.5%, especially less than 2%, in particular less than 1%, preferably less than 0.5%; and the colloidal dispersion having a concentration of the material in the divided state in said colloidal dispersion greater than 20 g/l, especially greater than 40 g/l, preferably greater than 60 g/l, in particular greater than 80 g/l, more preferably greater than 100 g/l; and the colloidal dispersion having a charge potential value $\zeta$, called the zeta potential, as determined by electrophoretic mobility shift analysis of said colloidal dispersion, which is negative and the absolute value of which is greater than 20 mV, especially greater than 30 mV, preferably greater than 40 mV.

In the following:

the "general composition" of the solid particles defines the totality of the metallic elements constituting the solid particles, each metallic element being assigned its stoichiometric proportion in the solid particles. In particular, the general composition does not take account of the non-metallic elements of the solid particles within the meaning of Mendeleev's classification, such as, for example, carbon, nitrogen, hydrogen and oxygen;

the expression "equivalent diameter" of a solid particle denotes the diameter of the circle having the same area as the orthogonal projection of said solid particle on a notional plane tangent to said solid particle. In particular, the "mean equivalent diameter" of the solid particles of a composition of solid particles can be evaluated by means known per se, especially with the aid of images obtained by transmission electron micrography or by high-resolution transmission electron microscopy. The mean equivalent diameter of the solid particles of a composition of solid particles is determined by measuring the diameter of at least 50 solid particles visualized on transmission electron microscopy slides, for example at a magnification factor of between 20,000 and 200,000. The median value of the histogram of the distribution of the measured sizes of the solid particles is the mean equivalent diameter of the solid particles of the composition of solid particles.

In a colloidal dispersion of a material in the divided state in an aqueous liquid phase, the physico-chemical properties of the material in the divided state, dried at ambient temperature, are characterized after separation of said material in the divided state and the aqueous liquid phase by centrifugation at an acceleration of between 15,000 g and 150,000 g at atmospheric pressure and ambient temperature, or by lyophilization of said colloidal dispersion.

In a colloidal dispersion of a material in the divided state in an aqueous liquid phase, the material in the divided state is formed of solid particles of the general composition (A), which describes the chemical composition of the solid particles in terms of metallic elements. Such a chemical composition can be determined by chemical analysis of the solid particles of the material in the divided state according to means known per se to the person skilled in the art. For example, it is possible to employ a method of analysis by inductively coupled plasma ICP atomic emission spectrometry.

The colloidal dispersion of a material in the divided state in an aqueous liquid phase according to the invention has a charge potential value $\zeta$, called the zeta potential, as determined by electrophoretic mobility shift analysis of said colloidal dispersion, which is negative and the absolute value of which is greater than 20 mV. Such a measurement of the electrophoretic mobility shift of the colloidal dispersion is determined by means known per se to the person skilled in the art, for example using a device of the nanosizer type (ZetaSizer Nano ZS90, Malvern Instruments, Worcestershire, England).

The inventors have observed that a material in the divided state of a colloidal dispersion according to the invention has superstoichiometry in terms of sulfide anions as compared with the chalcogenides $Cu_2ZnSnS_4$ known from the prior art. This superstoichiometry confers on the material in the divided state according to the invention a negative surface charge permitting the dispersion of said material in an aqueous liquid phase without addition of carbon-containing compounds either to the material in the divided state or to the aqueous liquid phase.

Furthermore, such a colloidal dispersion which is substantially free of carbon-containing compounds does not require treatment at high temperature of a film formed of the material in the divided state for the purpose of oxidative combustion and removal of the carbon-containing compounds. In particular, such a colloidal dispersion which is substantially free of carbon-containing compounds is adapted to be able to be employed by sintering under an inert gas atmosphere and under a selenium Se atmosphere in order to form a photoabsorbent film of a photovoltaic cell. Such sintering under an inert gas or Se atmosphere of a colloidal dispersion according to the invention allows a photoabsorbent film that is substantially free of carbon element to be obtained.

Advantageously, the solid particles are composed solely of the metallic elements of the general composition (A). In particular, the solid particles are free of surface-active hydrocarbon-containing compounds and of surface-active agents such as fatty acids, especially carboxylic acids, sulfonic acids and others.

Advantageously, the molar proportion (a) of the element $Zn^{2+}$ in the general composition (A) of the solid particles is between 1 and 1.5, in particular between 1 and 1.4.

Advantageously, the molar proportion (b) of the element $Sn^{4+}$ in the general composition (A) of the solid particles is between 1 and 1.3, in particular between 1 and 1.2.

Advantageously, the molar proportion (c) of the element $S^{2-}$ in the general composition (A) of the solid particles is between 4 and 8, in particular between 4 and 6.

Advantageously, the aqueous liquid phase is a continuous phase in which the solid particles forming the material in the divided state are distributed and which is free of surface-active hydrocarbon-containing compounds and of surface-active agents such as fatty acids, especially carboxylic acids, sulfonic acids and others.

Advantageously, such a colloidal dispersion of a material in the divided state in an aqueous liquid phase is prepared without addition of a carbon-containing organic compound, in particular a surface-active compound capable of modifying the surface tension of the solid particles and slowing down the settling of the solid particles of such a colloidal suspension.

Advantageously, the solid particles of the colloidal dispersion according to the invention have a content of substantially zero of carbon originating from compounds that are a source of sulfur used during the synthesis, such as thiocyanate ($SCN^-$), thiourea ($CS(NH_2)_2$) and thioacetamide ($CH_3$—S—$NH_2$). The inventors have observed that such solid particles that are free of carbon-containing compounds are adapted to permit the production of a photovoltaic film of increased efficiency as compared with the photovoltaic films of the prior art.

Advantageously, the material in the divided state of the colloidal dispersion according to the invention has a proportion by mass of the element carbon of less than 2.5%. The proportion by mass of the element carbon is determined based on the dry mass of the material in the divided state after lyophilization of the corresponding colloidal dispersion.

The value of such a proportion of the element carbon is determined by elemental chemical analysis known per se to the person skilled in the art. The proportion by mass can be determined by carrying out oxidative combustion of the material in the divided state and measuring the quantity of carbon dioxide produced during the combustion.

Advantageously, the colloidal dispersion according to the invention is a stable colloidal dispersion of a material in the divided state in an aqueous liquid phase chosen from the group formed of aqueous solutions and mixed solutions of water and at least one water-miscible solvent.

Advantageously and according to the invention, the solid particles of the material in the divided state have a mean equivalent diameter of between 15 nm and 350 nm, especially between 15 nm and 300 nm. The mean equivalent diameter of the solid particles can be between 15 nm and 250 nm, especially between 15 nm and 300 nm, in particular between 15 nm and 250 nm, preferably between 15 nm and 80 nm.

The solid particles of the general composition (A) of a colloidal dispersion according to the invention have a random size distribution in which less than 10% of the solid particles have a size greater than twice the median value of the size distribution and less than 10% of the solid particles have a size smaller than half the median value of the size distribution. The term solid particle denotes an individualized solid entity. Such a solid particle can be in the form of a single elementary crystallite forming an individualized solid particle, or in the form of a plurality of crystallites associated by aggregation within said individualized solid particle. In any case, the plurality of crystallites has a single structure as determined by X-ray diffraction.

According to a particular embodiment of the invention, the solid particles of the material in the divided state according to the invention are solid particles of generally isotropic shape (without a preferential direction of extension), the mean equivalent diameter of which is from 15 nm to 350 nm.

In particular, the solid particles of a colloidal dispersion according to the invention have, in an orthonormal spatial point, three orthogonal dimensions of the same order of magnitude.

Advantageously and according to the invention, the material in the divided state has a single crystalline structure, as determined by analysis of said material by X-ray diffraction. Advantageously and according to the invention, the crystalline structure is a kesterite structure.

Analysis by X-ray diffraction of the structure of the material in the divided state formed of solid particles of the general composition (A) shows an X-ray diffraction diagram which corresponds to the diagram for kesterite ($Cu_2ZnSnS_4$, JCPDS no. 00-026-0575 referenced in "*Joint Committee on Powder Diffraction Standards*"). In particular, the X-ray diffraction diagram of a material in the divided state according to the invention does not show a line attributable to structures of the type $Cu_2S$ (chalcosine, JCPDS no. 01-072-2276), CuS (coveline, JCPDS no. 01-076-1725), SnS (tin sulfide, JCPDS no. 00-040-1465), $Cu_3SnS_4$ (petrukite, JCPDS no. 00-036-0217), ZnS (wurtzite, JCPDS no. 00-036-1450, JCPDS no. 01-072-0163, JCPDS no. 01-075-1534), $Cu_9S_8$ (yarrowite, JCPDS no. 00-036-0379).

Advantageously and according to the invention, the solid particles have at least one domain, called the crystalline domain, having a mean size, measured by X-ray diffraction, of between 3 nm and 100 nm, especially between 3 nm and 80 nm, said crystalline domain having the single crystalline structure.

The mean size of each crystalline domain of the solid particles is determined by the person skilled in the art by X-ray diffraction (DRX) analysis means known per se, especially by application of the formula of Debye and Scherrer.

Advantageously and according to the invention, the colloidal dispersion is adapted so that more than 50 wt. %, especially more than 75 wt. %, preferably more than 90 wt. %, of the material in the divided state remains in suspension in the colloidal dispersion after treatment of said colloidal dispersion by centrifugation at an acceleration of 1250 g for a period of 10 minutes. A colloidal dispersion according to the invention is a dispersion that is stable to settling at an acceleration of 1250 g for 10 minutes.

In particular, the treatment is carried out by centrifugation of such a colloidal dispersion at ambient temperature in which the material in the divided state is in suspension in an aqueous liquid phase formed of water. In fact, the solid particles of such a colloidal dispersion according to the invention do not form aggregates.

The inventors have observed that the solid particles of a colloidal dispersion according to the invention form a stable suspension in aqueous solvents whereas the nanocrystals of the prior art are either surface modified by surface-active agents of organic nature or adapted to be able to be dispersed solely in non-polar solvents, especially in toluene. Such nanocrystals of the prior art have a surface layer of a hydrophobic and non-polar nature, in particular of a carbon-containing nature, coating said nanocrystals and which do not allow a high-performance photoabsorbent film to be obtained.

The inventors have found that it is possible to prepare a colloidal dispersion of a material formed of solid particles of the general composition (A) in an aqueous liquid phase and further having a concentration of solid particles which is high and adapted to permit its use on an industrial scale, but which at the same time is stable over time. In particular, the inventors have observed that such a colloidal dispersion is adapted to be able to be employed in robotized devices for applying liquid solutions to various substrates.

Advantageously and according to the invention, the solid particles of material in the divided state have, as determined by Raman spectroscopy, a diffusion line, called the primary line, having a maximum diffusion intensity at a wave number value of between $310\ cm^{-1}$ and $340\ cm^{-1}$, especially between $330\ cm^{-1}$ and $340\ cm^{-1}$, in particular substantially of the order of $336\ cm^{-1}$.

Advantageously, the primary line has a line width at half height of between $5\ cm^{-1}$ and $60\ cm^{-1}$, especially between $5\ cm^{-1}$ and $30\ cm^{-1}$.

Advantageously, in a first variant of a colloidal dispersion according to the invention, the material in the divided state is formed of polycrystalline solid particles. In such polycrystalline solid particles, the mean equivalent diameter of the crystalline domain(s) of the solid particles constituting the material in the divided state, measured by X-ray diffraction, is less than the mean equivalent diameter of said solid particles.

In this first variant, advantageously and according to the invention, the material in the divided state is formed of solid particles which have a mean equivalent diameter of between 15 nm and 350 nm and the mean size of the crystalline domain of which is between 4 nm and 20 nm.

Advantageously, in this first variant of a colloidal dispersion according to the invention, the material in the divided state has, as determined by Raman spectroscopy, a diffusion line, called the primary line, having a maximum diffusion intensity at a wave number value of between 330 $cm^{-1}$ and 340 $cm^{-1}$, especially substantially of the order of 336 $cm^{-1}$, and a line width at half height of between 5 $cm^{-1}$ and 60 $cm^{-1}$.

Advantageously, in a second variant of a colloidal dispersion according to the invention, the material in the divided state is formed of polycrystalline solid particles which have a mean equivalent diameter of between 15 nm and 300 nm and the mean size of the crystalline domain of which is between 15 nm and 80 nm.

In such polycrystalline solid particles, the mean diameter of each crystalline domain of the solid particles constituting the material in the divided state, measured by X-ray diffraction, is less than the mean equivalent diameter of said solid particles.

Advantageously, in this second variant of a colloidal dispersion according to the invention, the material in the divided state has, as determined by Raman spectroscopy, a diffusion line, called the primary line, having a maximum diffusion intensity at a wave number value of between 330 $cm^{-1}$ and 340 $cm^{-1}$, especially substantially of the order of 336 $cm^{-1}$, and a line width at half height of between 5 $cm^{-1}$ and 30 $cm^{-1}$.

Advantageously and in a third variant of a colloidal dispersion according to the invention, the mean size of each crystalline domain of the solid particles constituting the material in the divided state, measured by X-ray diffraction, is substantially of the order of magnitude of the mean equivalent diameter of said solid particles.

Advantageously, in this third variant of a colloidal dispersion according to the invention, the solid particles constituting the material in the divided state are monocrystalline solid particles. Such monocrystalline solid particles have a mean equivalent diameter, determined by electron microscopy, which is of the order of magnitude of, especially substantially equal to, the mean diameter of the crystalline domains as determined by X-ray diffraction. Advantageously, the colloidal dispersion according to the invention is formed of a material in the divided state formed of monocrystalline solid particles.

In this third variant, advantageously and according to the invention, the colloidal dispersion comprises solid particles which have a mean equivalent diameter of between 15 nm and 80 nm, especially between 15 nm and 60 nm, and the mean size of the crystalline domain of which is between 15 nm and 60 nm.

Advantageously, in this third variant of a colloidal dispersion according to the invention, the material in the divided state has, as determined by Raman spectroscopy, a diffusion line, called the primary line, having a maximum diffusion intensity at a wave number value of between 330 $cm^{-1}$ and 340 $cm^1$, especially substantially of the order of 336 $cm^{-1}$, and a line width at half height of between 5 $cm^{-1}$ and 22 $cm^{-1}$.

Advantageously, the material in the divided state of the colloidal dispersion according to the invention has, as determined by Raman spectroscopy, a secondary diffusion line having a maximum diffusion intensity at a wave number value of between 260 $cm^{-1}$ and 295 $cm^{-1}$, especially between 260 $cm^{-1}$ and 285 $cm^{-1}$.

Advantageously, the material in the divided state has, as determined by Raman spectroscopy, an additional secondary diffusion line having a maximum diffusion intensity at a wave number value of between 355 $cm^{-1}$ and 375 $cm^{-1}$, especially between 360 $cm^{-1}$ and 370 $cm^{-1}$, preferably of the order of 365 $cm^{-1}$.

Advantageously, a material in the divided state of a colloidal dispersion according to the invention can have at least one of the following features:
- a fraction of the cations of zinc ($Zn^{+2}$) is substituted by cations of cadmium ($Cd^{+2}$),
- a fraction of the cations of zinc ($Zn^{+2}$) can be in the form of ZnS colloid of small size or in the form of metal sulfide complexes extending at the surface of the particles,
- a fraction of the cations of tin ($Sn^{+4}$) is substituted by cations of titanium ($Ti^{+4}$), zirconium ($Zr^{+4}$) or lead ($Pb^{+4}$),
- a fraction of the cations of tin ($Sn^{+4}$) can be in the form of SnS, $SnS_2$ colloid of small size or in the form of metal sulfide complexes extending at the surface of the solid particles,
- the same fraction of the cations of zinc ($Zn^{+2}$) and of the cations of tin ($Sn^{+4}$) is substituted by cations chosen from the group formed of the cations of gallium ($Ga^{+3}$), the cations of indium ($In^{+3}$) and of yttrium ($Y^{+3}$),
- a fraction of the cations $In^{3+}$ and $Ga^{3+}$ is in the form of $Ga_2S_3$, $In_5S_3$ colloids or in the form of a metal sulfide complex at the surface of the solid particles,
- a fraction of the anions of sulfur ($S^{-2}$) is substituted by anions of selenium ($Se^{-2}$).

Advantageously and according to the invention, the water-miscible solvent is chosen from the group formed of the alcohols, especially methanol, isopropanol and ethyl alcohol, and acetonitrile.

Advantageously and according to the invention, the aqueous liquid phase has a pH value less than pH 10.5, especially less than pH 10, preferably less than pH 9.5.

In a colloidal dispersion of a material in the divided state in an aqueous liquid phase, the physico-chemical properties of the aqueous liquid phase are characterized after separation of the aqueous liquid phase and of the material in the divided state by centrifugation at an acceleration of between 15,000 g and 150,000 g at atmospheric pressure and ambient temperature, or by lyophilization of said colloidal dispersion.

Advantageously, the aqueous liquid phase comprises inorganic clusters of metal sulfides and nanoparticles of metal sulfides stabilized by such inorganic clusters of metal sulfides. Such nanoparticles of metal sulfides are in particular formed when the inorganic clusters are produced from saline solutions having a high molar ratio Zn/Sn, especially greater than 2. These nanoparticles of metal sulfides have a mean size below 20 nm, preferably below 10 nm, preferably below 5 nm.

The presence of these nanoparticles of metal sulfides at the surface of the solid particles, especially of CZTS, can be shown by transmission electron microscopy.

Advantageously and according to the invention, the aqueous liquid phase comprises at least one solute chosen from the group formed of $(NH_4)_2S$, $Sn_2S_6(NH_4)_4$, metal complexes based on Zn, Sn, Ga and In, and nanoparticles based on Zn and Sn in a proportion by mass in the aqueous liquid phase of less than 10%, especially less than 5%, of the total dry mass of the colloidal dispersion.

The aqueous liquid phase is a continuous phase which can also comprise complexes of sulfides of Zn, Sn, In and Ga, for example of the type $Sn_2S_6(NH_4)_4$, and nanoparticles of metal sulfides stabilized by metal sulfide complexes. The mass of the cations that are soluble in the aqueous liquid phase is less than 10%, preferably less than 5%, of the total dry mass of the colloidal dispersion.

Such an analysis of the aqueous liquid phase is carried out by liquid $^{119}$Sn nuclear magnetic resonance (NMR). The aqueous liquid phase has at least one resonance signal attributable to nanoparticles of metal sulfides or to metal sulfide complexes. A resonance signal is observed at a chemical shift δ of between 54 and 57 ppm. The publication (J. Am. Chem. Soc., 2010, 132; 29, 10085-10092) attributes the resonance signal at 56.3 ppm to the complex $(Sn_2S_6)^{4-}$.

Resonance signals attributable to less condensed forms of the type ortho-thiostannate or meta-thiostannate can also be observed in the chemical shift range from 66 ppm to 70 ppm, or in the chemical shift range from 78 ppm to 88 ppm.

Advantageously and according to the invention, the material in the divided state of the colloidal dispersion has, as determined by analysis by solid-phase $^{119}$Sn nuclear magnetic resonance, at least one resonance signal at a chemical shift value of the element $^{119}$Sn of between −350 ppm and −750 ppm, especially between −500 ppm and −650 ppm, preferably between −520 ppm and −600 ppm. Such an analysis by solid $^{119}$Sn NMR of the material in the divided state is carried out after separation of the solid material and the aqueous liquid phase of the colloidal dispersion as described above.

Advantageously and according to the invention, the material in the divided state has, as determined by analysis by infrared spectrometry, at least one absorption band having a maximum absorption intensity value at a wave number value of between 1390 cm$^{-1}$ and 1420 cm$^{-1}$.

Advantageously and according to the invention, the material in the divided state has, as determined by analysis by infrared spectrometry, at least one absorption band having a maximum absorption intensity value at a wave number value of between 1590 cm$^{-1}$ and 1625 cm$^{-1}$.

An analysis by infrared spectroscopy of the resulting material in the divided state is carried out by lyophilization of a colloidal dispersion according to the invention and packaged in the form of a disk of dry potassium bromide (KBr) known to the person skilled in the art.

Advantageously and according to the invention, the colloidal dispersion has a molar ratio $$\left(\frac{a-v-\frac{y}{2}}{b-w-\frac{y}{2}}\right) \text{ of } \frac{Zn}{Sn}$$

greater than 1, especially greater than 1.1, preferably greater than 1.2.

Advantageously and according to the invention, the colloidal dispersion has a molar ratio $$\frac{2}{\left(a-v-\frac{y}{2}\right)+\left(b-w-\frac{y}{2}\right)} \text{ of } \frac{Cu}{Zn+Sn}$$

of between 0.7 and 1.0, especially between 0.75 and 1.0, preferably between 0.8 and 1.0.

Advantageously, the solid particles of the colloidal dispersion according to the invention dispersed in the aqueous liquid phase are surface-charged solid particles. The surface charge is determined in a manner known to the person skilled in the art by electrophoretic mobility shift measurements. In particular, the aqueous liquid phase is of low ionic force and is adapted not to produce a screening constant with respect to the charges of the solid particles.

The invention relates also to a material in the divided state formed of solid particles of the following general composition (A):

(A), wherein:
a, b, c, v, w, x and y and their arithmetic combinations are real numbers which represent the molar proportion of each element with which each number is associated in formula (A), such that:
  1≤a<1.65;
  1≤b<1.40;
  4<c<9, and
  v, w, x and y belong independently of one another to the group of the real numbers belonging to the interval [0; 0.5[, and
    $^1X^{+4}$ is chosen from the group formed of the cations of titanium (Ti), the cations of zirconium (Zr) and the cations of lead (Pb),
    $^2X^{+3}$ is chosen from the group formed of the cations of gallium (Ga), the cations of indium (In) and the cations of yttrium (Y);
said material having:
  as determined by analysis of said material by X-ray diffraction, a single crystalline structure;
  as determined by elemental analysis, a proportion by mass of the element carbon of less than 2.5%, especially less than 2.0%, in particular less than 1.0%, preferably less than 0.5%.

Advantageously, the molar proportion (a) of the element $Zn^{2+}$ in the general composition (A) of the solid particles is between 1 and 1.5, in particular between 1 and 1.4.

Advantageously, the molar proportion (b) of the element $Sn^{4+}$ in the general composition (A) of the solid particles is between 1 and 1.3, in particular between 1 and 1.2.

Advantageously, the molar proportion (c) of the element $S^{2-}$ in the general composition (A) of the solid particles is between 4 and 8, in particular between 4 and 6.

Advantageously and according to the invention, the material in the divided state is adapted to be able to form a colloidal dispersion of said material in the divided state in an aqueous liquid phase chosen from the group formed of aqueous solutions and mixed solutions of water and at least one water-miscible solvent.

Advantageously and according to the invention, the solid particles of the material in the divided state have, as determined by Raman spectroscopy, a diffusion line, called the primary line, having a maximum diffusion intensity at a wave number value of between 310 cm$^{-1}$ and 340 cm$^{-1}$.

Advantageously and according to the invention, the solid particles of the material have a mean equivalent diameter of between 15 nm and 350 nm, especially between 15 nm and 300 nm. The mean equivalent diameter of the solid particles can be between 15 nm and 250 nm, especially between 15 nm and 80 nm.

Advantageously and according to the invention, the solid particles of the material have at least one domain, called the crystalline domain, having a mean size, measured by X-ray diffraction, of between 3 and 100 nm, especially between 15 nm and 80 nm, said crystalline domain having the single crystalline structure. Advantageously, the crystalline structure is a kesterite structure.

Advantageously and according to the invention, the material in the divided state has, as determined by analysis by $^{119}$Sn solid-phase nuclear magnetic resonance, at least one resonance signal at a chemical shift value of the element $^{119}$Sn of between −350 ppm and −750 ppm, especially between −500 ppm and −650 ppm, preferably between −520 ppm and −600 ppm.

Advantageously and according to the invention, the material in the divided state has, as determined by analysis by infrared spectrometry, at least one absorption band having a maximum absorption intensity value at a wave number value of between 1390 cm$^{-1}$ and 1420 cm$^{-1}$.

Advantageously and according to the invention, the material in the divided state has, as determined by analysis by infrared spectrometry, at least one absorption band having a maximum absorption intensity value at a wave number value of between 1590 cm$^{-1}$ and 1625 cm$^{-1}$.

An analysis by infrared spectroscopy of the resulting material in the divided state is carried out by lyophilization of a colloidal dispersion according to the invention and packaged in the form of a disk of dry potassium bromide (KBr) known to the person skilled in the art.

The invention relates also to such a material in the divided state according to the invention obtained by lyophilization, at a pressure of less than 10 hPa, preferably at a pressure of the order of 0.5 hPa, and at a temperature of below −80° C., especially below −60° C., preferably below −40° C., of a colloidal dispersion according to the invention.

The invention relates also to a process for the preparation of a colloidal dispersion according to the invention, in which:
an aqueous solution of salts of metal cations chosen from the group formed of $Zn^{2+}$, $Sn^{2+}$, $Sn^{4+}$, $Cd^{2+}$, $In^{3+}$, $Ga^{3+}$ and $Y^{3+}$ and of at least one mineral acid, the molar concentration of the metal cations in the aqueous solution being between 0.05 mol/l and 0.5 mol/l, is prepared; and then
an aqueous or aqueous-alcoholic solution, called the sulfide solution, of at least one sulfide chosen from the group formed of $Na_2S$ and $(NH_4)_2S$ is prepared; and then
at least one step of addition of the aqueous solution of salts of metal cations to the sulfide solution is carried out so as to form a solution of metal sulfide complexes, called inorganic clusters; and then
there are brought into contact and incubated:
a quantity of the solution of inorganic clusters;
a quantity of particles having:
as determined by X-ray diffraction, a crystalline structure $Cu_2ZnSnS_4$ of the kesterite or doped kesterite type; and
a mean equivalent diameter of between 15 nm and 350 nm;
optionally, a quantity of an aqueous solution of at least one sulfide at a concentration of between 0.01 mol/l and 1 mol/l;
a step of separation, especially by centrifugation, of solid particles and the aqueous solution is carried out;
the pellet is dispersed with an aqueous or aqueous-alcoholic solution optionally comprising at least one sulfide of the type $(NH_4)_2S$ so as to form a colloidal suspension of a material in the divided state in an aqueous liquid phase, the material having, as determined by elemental analysis, a proportion by mass of carbon element of less than 2.5%, especially less than 2%, in particular less than 1%, preferably less than 0.5%,
the colloidal dispersion having a concentration of the material in the divided state in said colloidal dispersion of greater than 20 g/l, especially greater than 40 g/l, preferably greater than 60 g/l, in particular greater than 80 g/l, more preferably greater than 100 g/l.

The invention relates also to a process for the production of a colloidal dispersion according to the invention, in which there is added to a quantity of a material in the divided state according to the invention in the form of a dry powder a volume of an aqueous liquid phase chosen from the group formed of aqueous solutions and mixed solutions of water and at least one water-miscible solvent so as to form a colloidal dispersion having a concentration of the material in said colloidal dispersion of greater than 20 g/l, especially greater than 40 g/l, preferably greater than 60 g/l, in particular greater than 80 g/l, more preferably greater than 100 g/l. Such a colloidal dispersion is prepared by simply adding water to the material in the divided state.

The aqueous liquid phase contains a concentration of $(NH_4)_2S$ of less than 0.1 mol/l, especially less than 0.05 mol/l, preferably less than 0.01 mol/l.

The invention relates also to the use of a solid material according to the invention in the preparation of a colloidal dispersion according to the invention, in which there is prepared a colloidal dispersion of said material in the divided state in an aqueous liquid phase chosen from the group formed of aqueous solutions and mixed solutions of water and at least one water-miscible solvent.

The invention relates also to the use of a colloidal dispersion according to the invention in the production of a photoabsorbent film of a photovoltaic cell, in which:
a quantity of said colloidal dispersion is placed on a solid substrate so as to form a film of said colloidal dispersion extending over the surface of said support and having a thickness of between 0.1 µm and 5 µm; and then
a step of treatment by sintering of said film under an Se atmosphere is carried out.

The invention relates also to a colloidal dispersion, to a material in the divided state and to the use of such a colloidal dispersion in the production of photovoltaic cells, characterized in combination by all or some of the features mentioned hereinabove or hereinbelow.

Other objects, features and advantages of the invention will become apparent upon reading the following description, which illustrates preferred embodiments of the invention by means of non-limiting examples of the preparation of colloidal dispersions starting from materials in the divided state and of processes for obtaining such materials according to the invention and in which.

A process for obtaining a colloidal suspension of a material in the divided state in an aqueous liquid phase given by way of a non-limiting example is described hereinbelow. In such a process for the preparation of a colloidal dispersion of a material in the divided state comprising solid particles of the general composition (A), particles having a crystalline structure of the kesterite or doped kesterite type are prepared. To that end:

(i) at least one precursor of each element constituting the material in the divided state of formula (A) is chosen;

(ii) a solid composition, called the precursor composition, is prepared by mixing the precursor(s) of each element constituting the solid material of the general composition (A) is prepared; and then (iii) the precursor composition is placed in a vessel under an inert gas atmosphere at a temperature of the order of ambient temperature;

(iv) the precursor composition is heated in a step, called the molten salt step, according to a rate of temperature increase which is between 0.5° C./minute and 10.0° C./minute and is adapted so that the temperature of the vessel reaches a synthesis temperature of between 250° C. and 500° C., especially between 350° C. and 450° C., and said synthesis temperature is maintained for a synthesis period of between 2 hours and 36 hours, especially between 4 hours and 26 hours, so as to form a recrystallized material having a single structure as determined by X-ray diffraction; and then (v) there is carried out, after cooling of the recrystallized material, a treatment of separation and washing of a solid material of formula (A) that is free of precursors;

(vi) following steps (i) to (v), the solid material of the general composition (A) that is free of precursors is subjected to a step of reduction of its particle size, especially by grinding;

(vii) there is then carried out a step of selection of the particles of the material having a particle size so reduced that is adapted to retain the particles having the smallest particle size.

Such a molten salt treatment of a precursor composition at a temperature of between 250° C. and 500° C., especially between 350° C. and 450° C., permits the formation of a powder of crystallized particles of nanometric size by precipitation or, preferably, by dissolution/reprecipitation accompanied by recrystallization, of said precursor composition.

In such a process:

the precursor(s) of copper (Cu) is(are) chosen from the group formed of copper(I) chloride (CuCl), dihydrated copper(II) chloride ($CuCl_2 2H_2O$), copper nitrate ($Cu(NO_3)_2$), copper acetate (($CH_3COO)_2Cu$), freshly prepared Cu hydroxides and freshly prepared Cu (oxy) hydroxides;

the precursor(s) of tin (Sn) is(are) chosen from the group formed of hydrated stannic chloride ($SnCl_4 5H_2O$), stannic acetate (($CH_3COO)_4Sn$), freshly prepared $Sn^{+4}$ hydroxides and freshly prepared $Sn^{+4}$ (oxy)hydroxides;

the precursor(s) of zinc (Zn) is(are) chosen from the group formed of zinc chloride ($ZnCl_2$), zinc acetate (($CH_3COO)_2Zn$), freshly prepared $Zn^{+2}$ hydroxides and freshly prepared $Zn^{+2}$ (oxy)hydroxides;

the precursor(s) of anion(s) is(are) chosen from the group formed of potassium thiocyanate (K—S≡N), thiourea (S=C($NH_2)_2$), hydrated sodium sulfide ($Na_2S, 9H_2O$), sodium sulfide ($Na_2S$), thioacetamide ($NH_2SCH_3$), potassium selenocyanate (K Se C N) and selenourea (SeC($NH_2)_2$);

the precursor(s) of doping agent(s) is(are) chosen from the group formed of gallium chloride ($GaCl_3$), cadmium chloride ($CdCl_2$), gallium nitrate ($Ga(NO_3)_3$), cadmium nitrate ($Cd(NO_3)_2$), cadmium iodide ($CdI_2$) and lead acetate ($CH_3COO)_4Pb$), yttrium nitrate ($Y(NO_3)_3$), gallium (oxy)hydroxides, lead (oxy)hydroxides and yttrium (oxy)hydroxides.

In a subsequent step of a process for the preparation of a colloidal dispersion according to the invention, crystalline particles of a metal chalcogenide, especially of CZTS, $Cu_2ZnSnS_4$, are treated by bringing into contact a suspension of said crystalline particles in water or a moist pellet of said crystalline particles—obtained by centrifugation—and a solution of inorganic clusters, especially based on cations of Zn, cations of Sn, cations of In, cations of Ga and sulfide anions.

Preparation of the Solution of Inorganic Clusters

An aqueous solution of salts of metal cations comprising $Zn^{2+}$ cations, for example in the form of ($ZnCl_2$), and $Sn^{2+}$ or $Sn^{4+}$ cations, for example in the form of ($SnCl_4$), is prepared. The molar ratio $Zn^{2+}/(Sn^{2+}+Sn^{4+})$ is between 0 and 4, especially between 1 and 3, preferably between 1 and 2.5. The pH of the aqueous solution of salts of metal cations must be adjusted so that the molar ratio $H^+$/metal cation in the aqueous solution of salts of metal cations is between 0.5 and 1.5. The proportion of $H^+$ in the aqueous solution of salts of metal cations is adjusted by adding a quantity of a mineral acid chosen from the group formed of HCl, $H_2SO_4$ and $HNO_3$. Under these conditions, the pH of the solution of inorganic clusters obtained by subsequent addition of the sulfide solution is between pH 8.5 and pH 10.5, preferably between pH 8.5 and pH 10.0, more preferably between pH 8.5 and pH 9.75.

The total concentration of salts of metal cations in the aqueous solution of salts of metal cations is between 0.01 mol/l and 0.50 mol/l, preferably between 0.05 mol/l and 0.3 mol/l.

It is possible for the aqueous solution of metal cations to comprise doping metal cations $M^{3+}$ chosen from $In^{3+}$ (indium), $Ga^{3+}$ (gallium) and $Y^{3+}$ (yttrium). The molar proportions ($\alpha/\beta/\gamma$) of the metal cations Zn/Sn/M in the aqueous solution of metal cations is such that:

$0.0 \leq \alpha < 0.8$;
$0.2 < \beta \leq 1.0$;
$0.00 \leq \gamma < 0.4$.

The doping metal cations are added to the aqueous solution of metal cations by dissolution of salts, especially chloride, chosen from $InCl_3$, $InCl_3 nH_2O$.

There is further prepared an aqueous solution of at least one sulfide $S^{2-}$, for example of sodium sulfide $Na_2S$ or ($NH_4)_2S$.

The solution of inorganic clusters is formed by the immediate or gradual and controlled addition of the aqueous solution of salts of metal cations to the aqueous solution of at least one sulfide $S^{2-}$ at ambient temperature over a period of greater than 30 minutes, especially greater than one hour, in particular of the order of 3 hours. The mixture is allowed to rest at ambient temperature for a period greater than 2 hours, preferably greater than 4 hours. There is obtained a visually clear solution, the pH of which is between pH 8.5 and pH 11 and which contains the inorganic clusters.

The molar ratio of the sulfides $S^{2-}$ and the metal cations in the solution of inorganic clusters is between 2 and 6, preferably between 2 and 4.

A quantity of crystalline particles of a metal chalcogenide in suspension in water or in the form of a moist centrifugation pellet is brought into contact with a quantity of the solution of inorganic clusters, with vigorous stirring. The contact time varies from 15 minutes to 24 hours. The mixture is then optionally diluted with an aqueous solution of $(NH_4)_2S$ at a concentration of 0.01 mol/l. It is possible to repeat this operation of contacting the solid pellet obtained by centrifugation with the solution of inorganic clusters. Impurities are removed by centrifugation and dispersion of the centrifugation pellet in a 0.01 mol/l solution of $(NH_4)_2S$ so as to obtain a colloidal dispersion of a material in the divided state of the formula $Cu_2ZnSnS_4$ according to the invention, which is substantially free of carbon-containing compounds, especially of thiourea and/or potassium thiocyanate (KSCN) and of degradation products of thiourea and/or of KSCN or of carbon-containing compounds of the surfactant type (for example oleylamine), and which is highly stable to settling. It is possible to repeat the operation of removing residual impurities.

There is obtained a colloidal dispersion according to the invention having a charge potential value ζ, called the zeta potential, as determined by electrophoretic mobility shift analysis of said colloidal dispersion, which is negative and the absolute value of which is greater than 30 mV.

An acquisition of a solid-state $^{119}Sn$ NMR spectrum is carried out using a Brucker AV400 spectrometer by magic angle spinning at the frequency of tin 149.01 MHz. The conditions of acquisition of a spectrum correspond to the irradiation of the sample under a pulse of $\pi/2$ (4 μs) a frequency of rotation of the rotor of 6 KHz, time intervals between each acquisition of 30 s and a number of accumulations of 1600. Such an acquisition is carried out for a CZTS material not modified according to the invention. A resonance signal is observed in the range of chemical shifts (δ) between −180 ppm and −120 ppm. This resonance signal is attributable to the CZTS particles not modified at the surface. Such an acquisition is also carried out for a material in the divided state according to the invention, that is to say obtained by treatment of CZTS particles with inorganic clusters. Additional resonance signals are observed in the range of chemical shifts (δ) between −350 ppm and −700 ppm.

It has been analyzed that this chemical shift corresponds neither to the chemical shift of $SnS_2$ described at δ=−760 ppm nor to the chemical shift of SnS described at δ=−299 ppm (J. Solid. Stat. Chem., (2003), 175, 359-365).

The stable colloidal dispersion is applied to a solid surface, especially to an outer surface of a solar cell electrode material, so as to form a film of said colloidal dispersion having a thickness of between 0.1 μm and 5 μm, especially of the order of 2 μm. Such an application is carried out by methods which require the use of concentrated colloidal dispersions and which are known per se, for example by tape casting or by a dip-coating process.

After drying of the film of said colloidal dispersion, there is carried out a step of densification by sintering of said film under an atmosphere of an inert gas, of a composition of an inert gas comprising a partial selenium pressure, or under reduced pressure of an inert gas at a temperature of between 400° C. and 600° C.

EXAMPLE 1

Production of a Material in the Divided State Based on Cu, Zn, Sn, S and Inorganic Clusters A powder composition comprising 0.674 g of copper(I) chloride ($CuCl2H_2O$, PROLABO, France, 6.82 mmol), 0.465 g of zinc(II) chloride ($ZnCl_2$, ALDRICH, France, 3.41 mmol), 1.19 g of tin(IV) chloride ($SnCl_45H_2O$, ACROS, France, 3.41 mmol) is prepared. The powder composition is dissolved in 20 ml of ethyl alcohol. The ethanolic solution is evaporated in vacuo so as to form a viscous paste. There are added to the viscous paste 4.97 g of potassium thiocyanate (K—S—C≡N, FLUKA ALDRICH, France, 51.15 mmol). The viscous paste is placed in a mixer (Analog Vortex mixer, VWR, France) so as to form a homogeneous mixture having molar proportions of (Cu, Zn, Sn, S) of (2, 1, 1, 15).

The viscous paste is transferred into a Pyrex crucible, which is placed in the chamber of an oven under a controlled nitrogen ($N_2$) atmosphere. The crucible is heated to 400° C. in 6 hours. The temperature of 400° C. is maintained in the chamber of the oven, still under nitrogen, for 16 hours. After thermal decline of the crucible, 200 ml of water are added to the solid obtained in the crucible, and the mixture is subjected to ultrasound treatment for a period of 60 minutes so as to dissolve excess potassium thiocyanate. The solid and the liquid potassium thiocyanate solution are separated by centrifugation at 1700 g for 20 minutes. The solid is washed twice with 200 ml of ethyl alcohol. A black-coloured solid is obtained and is dried at ambient temperature.

This synthesis is repeated four times in an identical manner, and the resulting solids are combined and dried at ambient temperature for a period of 48 hours.

The X-ray diffraction spectrum of the resulting powder is characteristic of a single crystalline structure $Cu_2ZnSnS_4$.

Grinding of the Solid Material 9 g of the crystallized solid as obtained above in Example 1, 60 g of grinding beads ($ZrO_2$—$Y_2O_3$) having a particle size of the order of 0.3 mm, and 20 ml of ethyl alcohol are placed in the receptacle of an attrition mill. The preparation is subjected to treatment by grinding for a period of 5 hours at ambient temperature. The grinding beads and the material in the divided state in suspension in ethyl alcohol are separated by sieve filtration. The grinding beads are washed several times with ethyl alcohol. The volume of ethyl alcohol containing the material in the divided state is 1500 ml. The suspension is centrifuged at 1470 g for 20 minutes, the supernatant ethyl alcohol is removed, and the pellet formed of the material in the divided state is taken up in 1500 ml of distilled water. The suspension is treated with ultrasound, with stirring, for a period of 5 minutes so as to form an aqueous suspension of the material in the divided state.

The aqueous suspension so obtained is subjected to a step of centrifugation at 1700 g for 20 minutes. The resulting clear supernatant is removed, and the resulting solid is again dispersed in 1500 ml of distilled water, with stirring and under ultrasound, for a period of 5 minutes.

The new aqueous suspension so obtained is subjected to a step of centrifugation at 1700 g for 20 minutes. The resulting clear supernatant is removed, and the resulting solid is again dispersed in 1500 ml of distilled water, with stirring and under ultrasound, for a period of 5 minutes.

The dispersion is subjected to a step of centrifugation at 1700 g for 20 minutes so as to form a black-coloured colloidal suspension ($S_1$) and a pellet, which is redispersed in 1500 ml of water. By successive washing with water and centrifugations, colloidal suspensions ($S_2$, $S_3$, $S_4$) are formed, which suspensions are combined to form a colloidal suspension $S_5$.

Preparation of a Solution of Inorganic Clusters Zn/Sn; 0.66/0.33

61.91 ml of a 20% aqueous-alcoholic solution of $(NH_4)_2S$ (d=1.1, 3.23 M) are placed in a beaker so as to form a 0.20 M solution in distilled water. 4.56 g of $ZnCl_2$ (MW 136.4, 33 mmol of Zn) and 6.02 g of $SnCl_4 5H_2O$ (MW 350.7, 17 mmol of Sn) are dissolved in 200 ml of a 0.2 M aqueous hydrochloric acid solution. The solution is made up to 250 ml by addition of a 0.2 M HCl solution. The molar ratio Zn/Sn of the inorganic salt is 2. The molar ratio $H^+/[Zn+Sn]$ is 1.0. The solution (Zn; Sn) is added immediately to the aqueous solution of $(NH_4)_2S$. After 8 hours, a visually clear solution is obtained, the pH of which is 9.46 and which contains the inorganic clusters. The molar ratio S/(Zn+Sn) is 4.

Surface Modification of the $Cu_2ZnSnS_4$ Particles

The colloidal suspension $S_5$ of $Cu_2ZnSnS_4$ particles obtained above is subjected to centrifugation at 1700 g so as to form a moist pellet. The moist pellet is placed in contact with 40 ml of the solution of inorganic clusters with stirring for one hour, and then in contact for 2 hours at ambient temperature. The suspension is centrifuged at 15,000 g for 20 minutes. The supernatant is removed, and the pellet is again placed in contact with 40 ml of the solution of inorganic clusters with stirring for one hour, and then in contact for 16 hours at ambient temperature. The suspension is centrifuged at 15,000 g for 20 minutes. The supernatant is removed, and the pellet is placed in contact with 40 ml of 0.01 M $(NH_4)_2S$ solution. The step of treatment with 40 ml of 0.01 M $(NH_4)_2S$ solution is repeated. The concentration of $Cu_2ZnSnS_4$ in the colloidal dispersion is 40 g/l.

Figure 1:
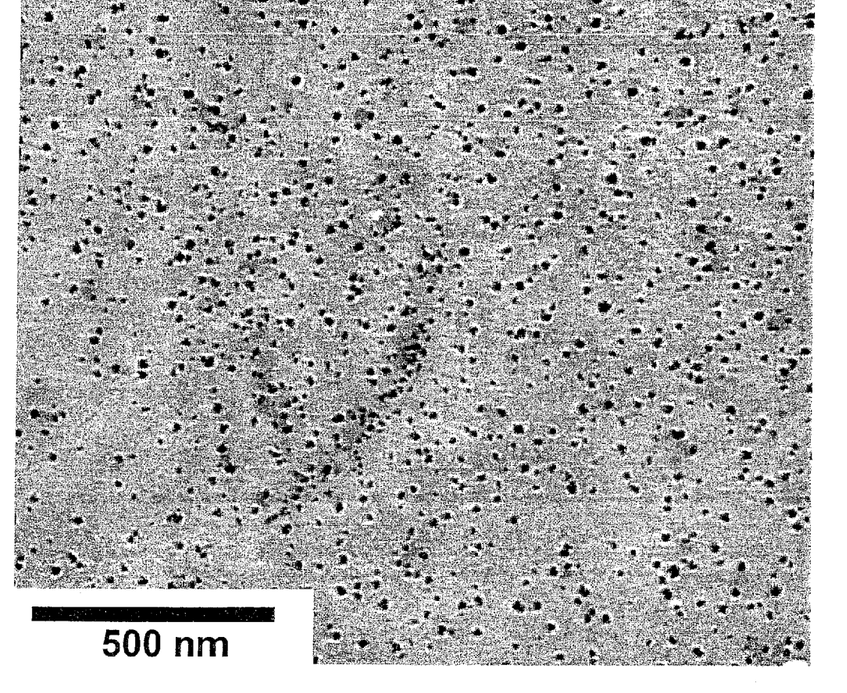
FIG. 1 shows a transmission electron microscope (TEM) slide of a colloidal dispersion according to the invention.

Examination by transmission electron microscopy shows perfectly individualized particles having a mean size of the order of 15 nm (FIG. 1).

The measured zeta potential of the colloidal dispersion according to the invention is −46 mV.

Material in the Divided State According to the Invention Redispersible in Water

The 40 g/l colloidal dispersion obtained above is lyophilized at a temperature of −40° C. and under a reduced pressure of 0.1 hPa. A material in the divided state formed of a powder of black-coloured solid particles is obtained. Analysis by X-ray diffraction carried out on the powder shows a single structure $Cu_2ZnSnS_4$. Spectroscopy of the powder dispersed in potassium bromide (KBr) shows centered lines at 1410 $cm^{-1}$ and 1600 $cm^{-1}$. Raman spectroscopy reveals a signal at a wave number value of the order of 336 $cm^{-1}$ and a line width of 22 $cm^{-1}$.

One volume of demineralized water is added to 100 mg of the lyophilized powder so as to form a volume of suspension of 2 ml. A colloidal suspension according to the invention which is stable over time and which has a concentration of 50 g/l of $Cu_2ZnSnS_4$ is obtained.

EXAMPLE 2

Production of a Colloidal Dispersion of a Material in the Divided State According to the Invention Based on Cu, Zn, Sn, S Formed of Polycrystalline Particles and Inorganic Clusters Zn; Sn of Stoichiometry 0.66; 0.33

1.73 g of hydrated tin(IV) chloride ($SnCl_4 5H_2O$, 4.95 mmol), 0.8 g of zinc(II) chloride ($ZnCl_2$, 5.85 mmol) and 1.534 g of copper(II) chloride ($CuCl_2\text{-}2H_2O$, 9 mmol) are introduced into 200 ml of ethylene glycol. The suspension of the metal salts so formed is stirred at ambient temperature until said metal salts have dissolved completely in the ethylene glycol. 3.42 g of thiourea $CS(NH_2)_2$ (FLUKA ALDRICH, France, 45 mmol) are then added to the solution of Sn(IV), Cu(II) and Zn(II), and stirring of said solution is maintained for 10 minutes at ambient temperature. 3.645 ml of a 25% solution of tetramethylammonium hydroxide (TMaOH) (9 mM) in methanol are then added, with stirring and at ambient temperature, and stirring is continued for 30 minutes. The solution is made up to 300 ml with ethylene glycol, and the mixture is stirred for a further 20 minutes. The molar proportions (Cu; Zn; Sn; S; OH) in the solution are (2; 1.3; 1.1; 10; 2).

The mixture is placed in a Teflon crucible, which is disposed in an autoclave (Parr bomb), without stirring, and placed in an oven at a temperature of 200° C. for 16 hours. The autoclave is then cooled by natural thermal decline to ambient temperature.

A precipitate is obtained, which is separated from the liquid solution of the mother liquors by centrifugation at 1720 g for 20 minutes at ambient temperature. The precipitate is washed with 300 ml of water, and the precipitate is recovered by centrifugation at 1720 g for 20 minutes at ambient temperature. This operation of washing the precipitate with water is repeated three times. The precipitate is recovered by centrifugation and rinsed in ethyl alcohol.

The synthesis described above in Example 1 is repeated once in an identical manner, and the two precipitates obtained are collected. After drying at ambient temperature for 48 hours, the precipitate is weighed (m=4 g).

Grinding of the Precipitate

The precipitate obtained above in Example 2 (4 g), 32 g of grinding beads (particle size of the order of 0.3 mm) formed of $ZrO_2$—$Y_2O_3$, and 10 ml of ethyl alcohol are placed in the receptacle of an attrition mill. The preparation is subjected to a grinding treatment for a period of 4 hours at ambient temperature. 10 ml of ethyl alcohol are added, and grinding is continued for a further 4 hours. The suspension of the ground material so obtained is stirred for about 12 hours in the presence of the grinding beads, and then the grinding beads and the suspension of said ground material are separated by filtration.

The grinding beads are washed several times in ethyl alcohol, and the grinding beads and the washing suspensions are separated from the ground material by filtration. The suspensions containing the ground material obtained by successive washings of the grinding beads are combined to form a suspension of the ground material in ethyl alcohol.

Centrifugation of the suspension is carried out at 2080 g for 20 minutes, during which a crude solid pellet comprising the ground material and a liquid supernatant is separated, which pellet is removed.

The resulting crude solid pellet is taken up and suspended in 600 ml of ethyl alcohol, alternatively the suspension is treated with ultrasound and by magnetic stirring and is centrifuged at 1470 g for 10 minutes. A residual pellet and a coloured (brown/black) supernatant formed of a suspension of the ground material in ethyl alcohol are obtained. The operation of washing the residual pellet is repeated twice in succession.

The three suspensions of the ground material (total volume 1800 ml) are mixed in ethyl alcohol. The concentration of the ground material in the divided state $Cu_2ZnSnS_4$ in the suspension is 0.8 g/l.

The suspension is analyzed by transmission electron microscopy after treatment of said suspension with ultrasound, deposition and drying on a membrane, during which individualized nanoparticles having a size of the order of 180 nm in the form of aggregates are visualized. These aggregates are composed of primary crystallites having a size of the order of 7 nm.

Analysis of the nanoparticles of the suspension by X-ray diffraction shows a group of lines attributable to the structure $Cu_2ZnSnS_4$.

The particles of the material are analyzed after dispersion in a resin by energy-dispersive spectroscopy under a scanning electron microscope (magnification ×2000) (EDS-SEM) over 5 statistically representative fields of observation. The measured molar ratios Zn/Cu=1 and Sn/Cu=1 show the stoichiometric composition of the material.

Preparation of a Solution of Inorganic Clusters

A solution of inorganic clusters Zn/Sn; 0.66/0.33 is prepared as described in Example 1. An additional step of purification of the inorganic clusters with the aim of removing the residual ammonium chloride ($NH_4Cl$) is carried out, in which 300 ml of acetone are added to 100 ml of the visually clear solution of inorganic clusters. After 6 hours, the solution becomes cloudy and forms a precipitate, which is isolated by centrifugation at 15,000 g. The isolated precipitate is taken up in 100 ml of an aqueous 0.01 M $(NH_4)_2S$ solution. After the precipitate has dissolved completely, 600 ml of acetone are added. The precipitate formed after 6 hours is recovered by centrifugation at 15,000 g. The supernatant is removed, and the centrifugation pellet is taken up in 50 ml of 0.01 M $(NH_4)_2S$.

Surface Modification of the $Cu_2ZnSnS_4$ Particles 1.78 g of $Cu_2ZnSnS_4$ particles obtained above in Example 2 and 30 ml of the solution of inorganic clusters at pH 9.23 as purified above are placed in contact, with stirring, for a period of 15 minutes. The mixture is made up to 80 ml with an aqueous 0.01 M $(NH_4)_2S$ solution, and incubation at ambient temperature is maintained for 2 hours.

The dispersion of particles is centrifuged, the supernatant is removed, and the pellet is taken up in 30 ml of the solution of inorganic clusters at pH 9.23. After stirring for a period of 15 minutes, the mixture is made up to 80 ml with an aqueous 0.01 M $(NH_4)_2S$ solution, and incubation at ambient temperature is again maintained for 2 hours. The dispersion is centrifuged, the supernatant is removed, and the pellet is taken up in 70 ml of aqueous 0.01 M $(NH_4)_2S$ solution. A colloidal dispersion according to the invention at a concentration of 25 g/l is obtained. The colloidal dispersion is stable over time to settling.

The measured zeta potential of the colloidal dispersion according to the invention is −37 mV.

Material in the Divided State According to the Invention Redispersible in Water

The 25 g/l colloidal dispersion obtained above is dried by lyophilization at a temperature of −40° C. and under a reduced pressure of 0.1 hPa. A material in the divided state formed of a powder of black-coloured solid particles is obtained. 70 ml of demineralized water are added to the material in the divided state. A colloidal suspension according to the invention which is stable over time is obtained.

EXAMPLE 3

Production of a Colloidal Dispersion of a Powder of Monocrystalline Particles Based on Cu, Zn, Sn, S and Surface Modified by Inorganic Clusters 1.73 g of hydrated tin(IV) chloride ($SnCl_4 5H_2O$, 4.95 mmol), 0.8 g of zinc(II) chloride ($ZnCl_2$, 5.85 mmol) and 1.534 g of copper(II) chloride ($CuCl_2·2H_2O$, 9 mmol) are introduced into 200 ml of ethylene glycol. The suspension of the metal salts so formed is stirred at ambient temperature until said metal salts have dissolved completely in the ethylene glycol. 3.42 g of thiourea $CS(NH_2)_2$ (FLUKA ALDRICH, France, 45 mmol) are then added to the solution of Sn(IV), Cu(II) and Zn(II), and stirring of said solution is maintained for 10 minutes at ambient temperature. 3.645 ml of a 25% solution of tetramethylammonium hydroxide (TMaOH) (9 mM) in methanol MeOH are then added, with stirring and at ambient temperature, and stirring is continued for 30 minutes. 1.584 g of ascorbic acid ($C_6H_8O_6$, ALDRICH, France, 9 mmol) are added. The solution is made up to 300 ml with ethylene glycol, and the mixture is stirred for a further 20 minutes. The molar proportions (Cu; Zn; Sn; S; OH; Asc) in the solution are (2; 1.3; 1.1; 10; 2; 2).

The mixture is placed in a Teflon crucible, which is disposed in an autoclave (Parr bomb), without stirring, and placed in an oven at a temperature of 200° C. for 16 hours. The autoclave is then cooled by natural thermal decline to ambient temperature.

A precipitate is obtained, which is separated from the liquid solution of the mother liquors by centrifugation at 1720 g for 20 minutes at ambient temperature. The precipitate is washed with 300 ml of water, and the precipitate is recovered by centrifugation at 1720 g for 20 minutes at ambient temperature. This operation of washing the precipitate with water is repeated three times. The precipitate is recovered by centrifugation and rinsed in ethyl alcohol.

The synthesis described above in Example 1 is repeated once in an identical manner, and the two precipitates obtained are collected. After drying at ambient temperature for 48 hours, the precipitate is weighed (m=4 g).

Grinding of the Solid Material

The precipitate obtained above (4 g), 32 g of grinding beads (particle size of the order of 0.3 mm) formed of $ZrO_2$—$Y_2O_3$, and 10 ml of ethyl alcohol are placed in the receptacle of an attrition mill. The preparation is subjected to a grinding treatment for a period of 4 hours at ambient temperature. 10 ml of ethyl alcohol are added, and grinding is continued for a further 4 hours. The suspension of the ground solid is stirred for 12 hours in the presence of the grinding beads, and then the grinding beads and the suspension of said solid material are separated by filtration.

The grinding beads are washed several times in ethyl alcohol, and the grinding beads and the washing suspensions are separated from the ground material by filtration. The suspensions containing the solid material obtained by successive washings of the grinding beads are combined to form a suspension of the solid material in ethyl alcohol.

Centrifugation of this suspension is carried out at 2080 g for 20 minutes, during which a crude solid pellet comprising the solid material and a liquid supernatant is separated, which pellet is removed.

The crude solid pellet obtained is taken up and suspended in 600 ml of ethyl alcohol, alternatively the suspension is treated with ultrasound and by magnetic stirring and is centrifuged at 1470 g for 10 minutes. A residual pellet and a coloured (brown/black) supernatant formed of a suspension of the solid material according to the invention in ethyl alcohol are obtained. The operation of washing the residual pellet is repeated twice in succession.

The three suspensions of the solid material (total volume 1800 ml) are mixed in ethyl alcohol. The concentration of the solid material in the divided state $Cu_2ZnSnS_4$ in the suspension is 0.8 g/l. The suspension stored in sealed vessels is stable to settling for more than 4 days. The suspension obtained is allowed to evaporate at ambient temperature so as to form a crystallized solid.

Thermal Treatment as Molten Salts 0.5 g of the powder of particles (Cu$_2$; Zn; Sn; S$_4$) obtained above is mixed with 3.0 g of KSCN. The molar proportion (S)/(Cu) in the mixture is 6. The mixture, placed in an aluminium crucible, is introduced into a vessel under a nitrogen atmosphere at ambient temperature. The vessel is heated so that its temperature increases steadily and reaches 500° C. in 150 minutes, and then that temperature of 500° C. is maintained in the vessel for 6 hours. After natural cooling of the vessel, the calcined powder is taken up in 200 ml of demineralized water, and the suspension is homogenized by magnetic stirring for 30 minutes so that the residual KSCN passes into solution in water. The suspension so obtained is centrifuged at 1700 g for 20 minutes, the supernatant is removed, and the solid obtained is taken up in 200 ml of demineralized water by homogenization for 20 minutes. A suspension (S1) is formed.

Selection of (Fine) Particles of Small Size

The suspension (S1) obtained is centrifuged at 1720 g for 20 minutes so as to form a solid pellet (C1) and a coloured dispersion (D1), which is subjected to centrifugation at 8000 g for 20 minutes in order to recover fine particles. The solid fraction from centrifugation at 8000 g constitutes the fine fraction F1.

The solid pellet (C1) is taken up and dispersed in 160 ml of distilled water by magnetic stirring for 20 minutes in order to form a suspension (S2). Centrifugation of the suspension (S2) at 1720 g for 20 minutes yields a coloured dispersion (D2), which is subjected to a step of centrifugation at 8000 g for 20 minutes. The solid fraction from centrifugation at 8000 g constitutes the fine fraction F2.

The step of selection of the particles of small size is repeated, and a second fine fraction F3 is obtained. The fine fractions F1, F2 and F3, which constitute a crystallized material, are collected.

Preparation of a Solution of Inorganic Clusters 0.3 g of particles forming the crystallized material obtained in Example 3 and 3.4 ml of the solution of inorganic clusters as prepared in Example 1 are placed in contact. The molar ratio (Zn+Sn) in the solution of inorganic salts and of Zn in the crystallized material is 0.5. The mixture is then diluted with an aqueous 0.01 M (NH$_4$)$_2$S solution to obtain a suspension volume of 7.5 ml, and contact is maintained at ambient temperature for 2 hours.

The suspension is centrifuged at 1700 g for 20 minutes, and the step of contact of the particles of crystallized material with 3.4 ml of the solution of inorganic clusters is repeated. Stirring is carried out for one hour, and then the volume is made up to 7.5 ml with an aqueous 0.01 M (NH$_4$)$_2$S solution. Contact is maintained at ambient temperature for 16 hours.

The suspension is centrifuged at 1700 g for 20 minutes, the supernatant is removed, and the pellet is dispersed in 7.5 ml of aqueous 0.01 M (NH$_4$)$_2$S solution. Stirring is carried out for one hour, and centrifugation is carried out at 15,000 g for 20 minutes. The pellet of particles is redispersed and washed in 7.5 ml of aqueous 0.01 M (NH$_4$)$_2$S solution. After centrifugation at 15,000 g and then removal of the supernatant, the pellet is taken up in a volume of the aqueous 0.01 M (NH$_4$)$_2$S solution so as to form a colloidal dispersion according to the invention at a concentration of 25 g/l.

Material in the Divided State According to the Invention Redispersible in Water

The 25 g/l colloidal dispersion obtained above is dried by lyophilization at a temperature of −40° C. and under a reduced pressure of 0.1 hPa. A material in the divided state formed of a powder of black-coloured solid particles is obtained.

Analysis by X-ray diffraction carried out on the powder shows a single structure Cu$_2$ZnSnS$_4$. Spectroscopy of the powder dispersed in potassium bromide (KBr) shows centered lines at 1410 cm$^{-1}$ and 1600 cm$^{-1}$. Raman spectroscopy reveals a signal at a wave number value of the order of 336 cm$^{-1}$ and a line width of 20 cm$^{-1}$.

A volume of demineralized water is added to 100 mg of the lyophilized powder so as to form a volume of suspension of 4 ml. A colloidal suspension according to the invention is obtained which is stable over time and which has a concentration of Cu$_2$ZnSnS$_4$ of 25 g/l.

The invention claimed is:

1. A colloidal dispersion of a material in the divided state in an aqueous liquid phase selected from the group consisting of aqueous solutions and mixed solutions of water with at least one water-miscible solvent, said material in the divided state being formed of solid particles of the following general composition (A):

$$(Cu^{+1}{}_2; Zn^{+2}{}_{a-v-(y/2)}; Cd^{+2}{}_v; Sn^{+4}{}_{b-w-(y/2)}; {}^1X^{+4}{}_w; {}^2X^{+3}{}_y; S^{-2}{}_{c-x}; Se^{-2}{}_x) \quad (A),$$

wherein:

a, b, c, v, w, x and y and arithmetic combinations thereof are real numbers which represent a molar proportion of each element with which each number is associated in formula (A), such that:

1≤a<1.65;
1≤b<1.40;
4<c<9, and
v, w, x and y belong independently of one another to the group of the real numbers belonging to the interval 0≤each of v, w, x, and y<0.5, and
$^1X^{+4}$ is selected from the group consisting of cations of titanium (Ti), cations of zirconium (Zr) and cations of lead (Pb),
$^2X^{+3}$ is selected from the group consisting of cations of gallium (Ga), cations of indium (In) and cations of yttrium (Y); and the material in the divided state having, as determined by elemental analysis, a proportion by mass of carbon element of less than 2.5%;

the colloidal dispersion having a concentration of the material in the divided state in said colloidal dispersion greater than 20 g/l;

the colloidal dispersion having a charge potential value ζ, called the zeta potential, as determined by electrophoretic mobility shift analysis of said colloidal dispersion, which is negative and the absolute value of which is greater than 20 mV.

2. The colloidal dispersion as claimed in claim 1, wherein the solid particles of the material in the divided state have a mean equivalent diameter of between 15 nm and 350 nm.

3. The colloidal dispersion as claimed in claim 2, wherein the material in the divided state has, as determined by analysis of said material by X-ray diffraction, a single crystalline structure.

4. The colloidal dispersion as claimed in claim 1, wherein the material in the divided state has, as determined by analysis of said material by X-ray diffraction, a single crystalline structure.

5. The colloidal dispersion as claimed in claim 4, wherein the material in the divided state has at least one crystalline domain, having a mean size, measured by X-ray diffraction, of between 3 nm and 100 nm, said crystalline domain having the single crystalline structure.

6. The colloidal dispersion as claimed in claim 1, wherein more than 50 wt. % of the material in the divided state remains in suspension in the colloidal dispersion after treatment of said colloidal dispersion by centrifugation at an acceleration of 1250 g for a period of 10 minutes.

7. The colloidal dispersion as claimed in claim 1, wherein the water-miscible solvent is an alcohol or acetonitrile.

8. The colloidal dispersion as claimed in claim 1, wherein the solid particles of the material in the divided state have, as determined by Raman spectroscopy, a primary diffusion line having a maximum diffusion intensity at a wave number value of between 310 cm$^{-1}$ and 340 cm$^{-1}$, said primary diffusion line having a line width at half height of between 5 cm$^{-1}$ and 60 cm$^{-1}$.

9. The colloidal dispersion as claimed in claim 1, wherein the material in the divided state has, as determined by analysis by infrared spectrometry, at least one absorption band having a maximum absorption intensity value at a wave number value of between 1390 cm$^{-1}$ and 1420 cm$^{-1}$ and a maximum absorption intensity value at a wave number value of between 1590 cm$^{-1}$ and 1625 cm$^{-1}$.

10. The colloidal dispersion as claimed in claim 1, wherein the aqueous liquid phase comprises at least one solute selected from the group consisting of $(NH_4)_2S$, $Sn_2S_6(NH_4)_4$, metal complexes based on Zn, Sn, Ga and In, and nanoparticles based on Zn and Sn in a proportion by mass in the aqueous liquid phase of less than 10% of the total dry mass of the colloidal dispersion.

11. A process for the preparation of a colloidal dispersion as claimed in claim 1, comprising:
preparing an aqueous solution of salts of metal cations selected from the group consisting of $Zn^{2+}$, $Sn^{2+}$, $Sn^{4+}$, $Cd^{2+}$, $In^{3+}$, $Ga^{3+}$ and $Y^{3+}$ and of at least one mineral acid, the metal cations having a molar concentration in the aqueous solution being between 0.05 mol/l and 0.5 mol/l; and then
preparing an aqueous or aqueous-alcoholic sulfide solution of at least one sulfide selected from the group consisting of $Na_2S$ and $(NH_4)_2S$; and then
at least one step of adding the aqueous solution of salts of metal cations to the sulfide solution so as to form a solution of metal sulfide complexes, called inorganic clusters; and then
contacting and incubating:
(i) a quantity of the solution of inorganic clusters
(ii) a quantity of solid particles that have, as determined by X-ray diffraction, a crystalline structure $Cu_2ZnSnS_4$ of kesterite or doped kesterite type, and a mean equivalent diameter of between 15 nm and 350 nm; and
(iii) optionally, a quantity of an aqueous solution of at least one sulfide at a concentration of between 0.01 mol/l and 1 mol/l,
separating by centrifugation the solid particles and the aqueous solution, said solid particles being in a form of pellet after separation is carried out;
dispersing the pellet with an aqueous or aqueous-alcoholic solution optionally comprising at least one sulfide of the type $(NH_4)_2S$ so as to form a colloidal suspension of a material in the divided state in an aqueous liquid phase, the material in the divided state having, as determined by elemental analysis, a proportion by mass of carbon element of less than 2.5%, the colloidal dispersion having a concentration of the material in the divided state in said colloidal dispersion of greater than 20 g/l, the colloidal dispersion having a charge potential ζ, called the zeta potential, as determined by the electrophoretic mobility shift analysis of said colloidal dispersion, which is negative and the absolute value of which is greater than 20 mV.

12. A process for the production of a photoabsorbent film of a photovoltaic cell, comprising:
placing a quantity of a colloidal dispersion as claimed in claim 1 on a solid substrate so as to form a film of said colloidal dispersion extending on the surface of said substrate and having a thickness of between 0.1 μm and 5 μm; and then
treating by sintering of said film under an Se atmosphere.

13. A material in the divided state formed of solid particles of the following general composition (A):

(A), wherein:
a, b, c, v, w, x and y and arithmetic combinations thereof are real numbers which represent a molar proportion of each element with which each number is associated in formula (A), such that:
$1 \le a < 1.65$;
$1 \le b < 1.40$;
$4 < c < 9$, and
v, w, x and y belong independently of one another to the group of the real numbers belonging to the interval $0 \le$ each of v, w, x, and $y < 0.5$, and
$^1X^{+4}$ is selected from the group consisting of cations of titanium (Ti), cations of zirconium (Zr) and cations of lead (Pb),
$^2X^{+3}$ is selected from the group consisting of cations of gallium (Ga), cations of indium (In) and cations of yttrium (Y);
said material having:
as defined by analysis of said material by X-ray diffraction, a single crystalline structure; and
as defined by elemental analysis, a proportion by mass of the element carbon of less than 2.5%.

14. The material as claimed in claim 13, wherein the material is able to form a colloidal dispersion of said material in the divided state in an aqueous liquid phase selected from the group consisting of aqueous solutions and mixed solutions of water with at least one water-miscible solvent.

15. The material as claimed in claim 14, wherein the solid particles of the material in the divided state have:
a mean equivalent diameter of between 15 nm and 350 nm; and
at least one crystalline domain having a mean size, measured by X-ray diffraction, of between 3 nm and 100 nm, said crystalline domain having a single crystalline structure.

16. The material as claimed in claim 13, wherein the solid particles of the material in the divided state have:
a mean equivalent diameter of between 15 nm and 350 nm; and
at least one crystalline domain, having a mean size, measured by X-ray diffraction, of between 3 nm and 100 nm, said crystalline domain having a single crystalline structure.

17. The material as claimed in claim 13, wherein the solid particles of the material in the divided state have, as determined by Raman spectroscopy, a primary diffusion line having a maximum diffusion intensity at a wave number value of between 310 cm$^{-1}$ and 340 cm$^{-1}$.

\* \* \* \* \*